(12) United States Patent
Yoshino et al.

(10) Patent No.: US 6,344,735 B1
(45) Date of Patent: Feb. 5, 2002

(54) SPECTRUM ANALYZER AND SPECTRUM MEASURING METHOD USING THE SAME

(75) Inventors: Yuji Yoshino; Yoshiaki Miyamae, both of Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/527,938

(22) Filed: Mar. 16, 2000

(30) Foreign Application Priority Data

Apr. 7, 1999 (JP) .......................................... 11-099909

(51) Int. Cl.⁷ .............................................. G01R 23/02
(52) U.S. Cl. ................ 324/76.39; 324/76.42; 702/67; 702/76
(58) Field of Search ............................. 324/76.27, 612, 324/121 R, 76.39, 76.42, 76.48, 77; 342/135; 381/320; 128/663; 702/66, 67, 77

(56) References Cited

U.S. PATENT DOCUMENTS

| | | | | |
|---|---|---|---|---|
| 3,649,765 A | * | 3/1972 | Rabiner | |
| 4,611,164 A | * | 9/1986 | Mitsuyoshi | |
| 4,751,929 A | * | 6/1988 | Hayakawa | |
| 5,384,891 A | * | 1/1995 | Asakawa | |
| 5,818,215 A | | 10/1998 | Miyamae et al. | |
| 5,999,119 A | * | 12/1999 | Carnes | |
| 6,104,882 A | * | 8/2000 | Melanson | |

FOREIGN PATENT DOCUMENTS

| | | |
|---|---|---|
| DE | 9013938 | 1/1991 |
| DE | 19615651 | 10/1996 |
| DE | 19647090 | 5/1997 |
| EP | 555491 | 8/1993 |

* cited by examiner

Primary Examiner—Vinh P. Nguyen
Assistant Examiner—Trung Nguyen
(74) Attorney, Agent, or Firm—David N. Lathrop, Esq.; Gallagher & Lathrop

(57) ABSTRACT

A power spectrum waveform is obtained by logarithmically amplifying a signal received by a frequency-sweep operation, detecting the amplified output of each frequency sweep, converting the detected output into a digital signal value in decibels, and converting this digital signal value into an antilogarithmic power value in watts for each display point within the width of the frequency sweep. Upon completion of the frequency sweep operation, the power values which have been converted into antilogarithmic values for each frequency sweep are averaged for each display point, the average power values are converted into logarithmic values, and the logarithmic values are displayed as a spectrum display.

8 Claims, 6 Drawing Sheets

SPECTRUM ANALYZER AND SPECTRUM MEASURING METHOD USING THE SAME

BACKGROUND OF THE INVENTION

The present invention relates to a spectrum analyzer that repeats to sweep frequencies of a received signal, logarithmically amplifies the received signal, detects the amplified output, and converts the detected output into a digital signal value to display the spectrum of the received signal. More particularly, the present invention relates to an apparatus and a method for displaying a power spectrum of the received signal.

FIG. 1 shows a conventional spectrum analyzer. An input signal from an input terminal 11 is inputted to a frequency converter 12, where the input signal is frequency-mixed with a local signal from a local oscillator 13 to be converted into an intermediate frequency signal. This intermediate frequency signal is passed through an intermediate frequency bad-pass filter 14. The output of the filter 14 is logarithmically amplified by a logarithmic amplifier 15, and its dynamic range is compressed. The logarithmically amplified output is envelope-detected by a detector 16. The detected output is sampled by an AD converter 17 at a constant period, and each sample is converted into a digital value. This digital value is stored in a memory 18.

On the other hand, a central frequency of the signal to be received, a frequency band width, a frequency-sweep speed, a reference level and the like are inputted to the spectrum analyzer from input means 19. In accordance with those inputted data, a CPU (a central processing unit) reads out a program stored in a program memory 22, decodes and executes the program, and sets an oscillation central frequency of the local oscillator 13. In addition, the CPU controls a sweep signal generator 20 then the sweep signal generator 20 sweep-controls the oscillation frequency of the local oscillator 13 so that receivable frequencies of the input signal from the input terminal 11 can repeatedly be swept.

In the conventional trace-average displaying method, digital values $P_{in}$ (dBm) obtained in the repeated frequency-sweeps for each of display points (pixels) i (i=1,2, . . . , N) on a frequency axis (usually lateral axis) of a display device 24 are read out from the memory 18, and the average value of those digital values Pin is obtained using a following equation by an average value calculating part 25.

$$P_{iavg} = \frac{1}{M}\sum_{n=1}^{M} P_{in}(\text{dBm})$$

$P_{in}$ is a power value obtained by nth sweep for ith display point, and the unit thereof is dBm for representing 1 mW to be 0 (zero) dB. In this manner, an average power $P_{iavg}$ for each display point i obtained by M sweeps is read out from an average value memory 26 and is displayed by the display device 24 under control of a display control part 23. For example as shown in FIG. 2, the average values $P_{iavg}$ are displayed on the longitudinal axis on a screen of the display device 24 for the respective display points 1–N on the lateral axis (frequency axis).

In this trace-average displaying method, an averaging process of the signal power values $P_i$ (dBm) for each display point is performed. Therefore, this method is effective for averaging noises added on top of the signal. However, the measured values $P_i$ for each display point are values each having been logarithmically compressed by the logarithmic amplifier 15, and an arithmetic average of those logarithmic values is simply calculated. For this reason, the calculated value of the arithmetic average is not a correct average of the power of the input signal for the display point (frequency) i. That is, the trace-average displaying method does not display a correct average power distribution.

A digital-modulated signal has similarities to a white noise, and its amplitude probability density function depends on characteristics of the modulation type and the base-band filter modulation bit. The function for performing a channel power measurement provided in the conventional spectrum analyzer is described, for example, in the article entitled "Measure Adjacent-Channel Power With A Spectrum Analyzer" written by J. Wolf and B. Buxton in a magazine "Microwave & RF", June 1997. This function measures a power for each display point and obtains a channel power by the following equation.

$$10\log\left[\frac{CHBW}{RBW \times k_n} \times \frac{1}{n_2 - n_1} \times \sum_{n_1}^{n_2} 10^{\frac{P_i(dBm)}{10}}\right](\text{dBm})$$

In this case, $n_1$ and $n_2$ are display point numbers of both sides of the channel, CHBW is the channel band width, RBW is the resolution band width of the spectrum analyzer, $P_i$ is a level of ith display point (dBm), and k is a correction coefficient for the resolution band width (RBW×$k_n$=power band width).

That is, measured values $P_i$ (dBm) for each display point are converted into true values $10^{Pi/10}$ (mW) each having unit of watt (mW), and an average of the true values for each display point in the channel band is calculated. Further, power per channel band is obtained using the average value, and the logarithmic value of the power is displayed. In this case, the power of the entire channel band can be obtained, but the power of each spectrum or the power density of each display point cannot be obtained. In addition, a spectrum display of the power cannot also be performed.

Furthermore, it is described in the aforementioned magazine that the following equation is applied to the detected output voltage $V_{video}$ of the spectrum analyzer to obtain the power of each display point.

$$V_{rms} = \sqrt{\frac{1}{T}\int_0^T V_{video}^2 dt} \quad (1)$$

In this case, T is a power measuring time, and $V_{Video}$ is an output voltage of an envelope detector.

In this case, the detected output voltage $V_{Video}$ must have a linear scale. That is, the amplifier 15 having a linear amplification characteristic instead of a logarithmic amplification characteristic is used. Therefore, in order to materialize a power measurement of an input signal having a large dynamic range, it is necessary to use an amplifier, a detector and an AD converter each having a linear characteristic and a large dynamic range. Consequently, the equipment becomes expensive. On the other hand, if a logarithmic amplifier is used to obtain a large dynamic range by a low cost equipment configuration, the integrated value of the equation (1) does not represent a correct power value. In addition, the arithmetic operation of the equation (1) is applied to the output of the AD converter 17 in FIG. 1. Therefore, it is necessary to provide a specialized integration circuit for performing this arithmetic operation, and to perform the arithmetic operation at sufficiently high speed through digital calculations. It is shown that stable results can be obtained, and more accurate results can be obtained by increasing the integration time T, namely by increasing the sweep time.

However, it is not described in the magazine as to whether the sweep operation of the input frequencies is stopped during the time when the power value of one display point is being obtained, namely during the integration time T, or the input frequencies are swept at a uniform speed and the integrated value of the detected output $V_{video}$ for each time length T is assumed to be the power value of one display point. In either case, in order to obtain the measured result, namely the stable integrated value of power, it is necessary to make the integration time T of each display point a relatively large value. In order to obtain the measured results of one channel band, namely the power spectrum display, it takes relatively long time. In addition, it is necessary to specially provide an integration circuit for performing the digital calculations of the equation (1) at sufficiently high speed, and in order to obtain the stable result during the integration time T, a considerable number of samples are required. It is necessary to considerably increase the sampling rate of the AD converter 17 in FIG. 1, and hence the AD converter 17 becomes expensive.

It is an object of the present invention to provide a spectrum analyzer that can display a correct power spectrum of an input signal having a large dynamic range and can be constructed at low cost, and to provide a spectrum measuring method using the spectrum analyzer.

It is another object of the present invention to provide a spectrum analyzer that can immediately display a power spectrum of an input signal regardless of modulation mode and can stably display more correct power values as time passes, and to provide a spectrum measuring method using the spectrum analyzer.

SUMMARY OF THE INVENTION

According to the present invention, sweeping of received frequencies is repeated, the received signal is logarithmically amplified, the amplified output is detected, the detected output is converted into a digital signal value, the digital signal value (dBm) is converted into a power value of anti-logarithm in watt (mW) dimension for each display point within a width of the frequency sweep, the power values having been converted into anti-logarithms that are obtained at respective frequency sweeps are averaged for each display point, the average power value for each display point is converted into a logarithmic value, and those logarithmic average power values for respective display points are displayed as a spectrum display.

DETAILED DESCRIPTION OF THE PREFERRED EMBODIMENTS

Figure 1:
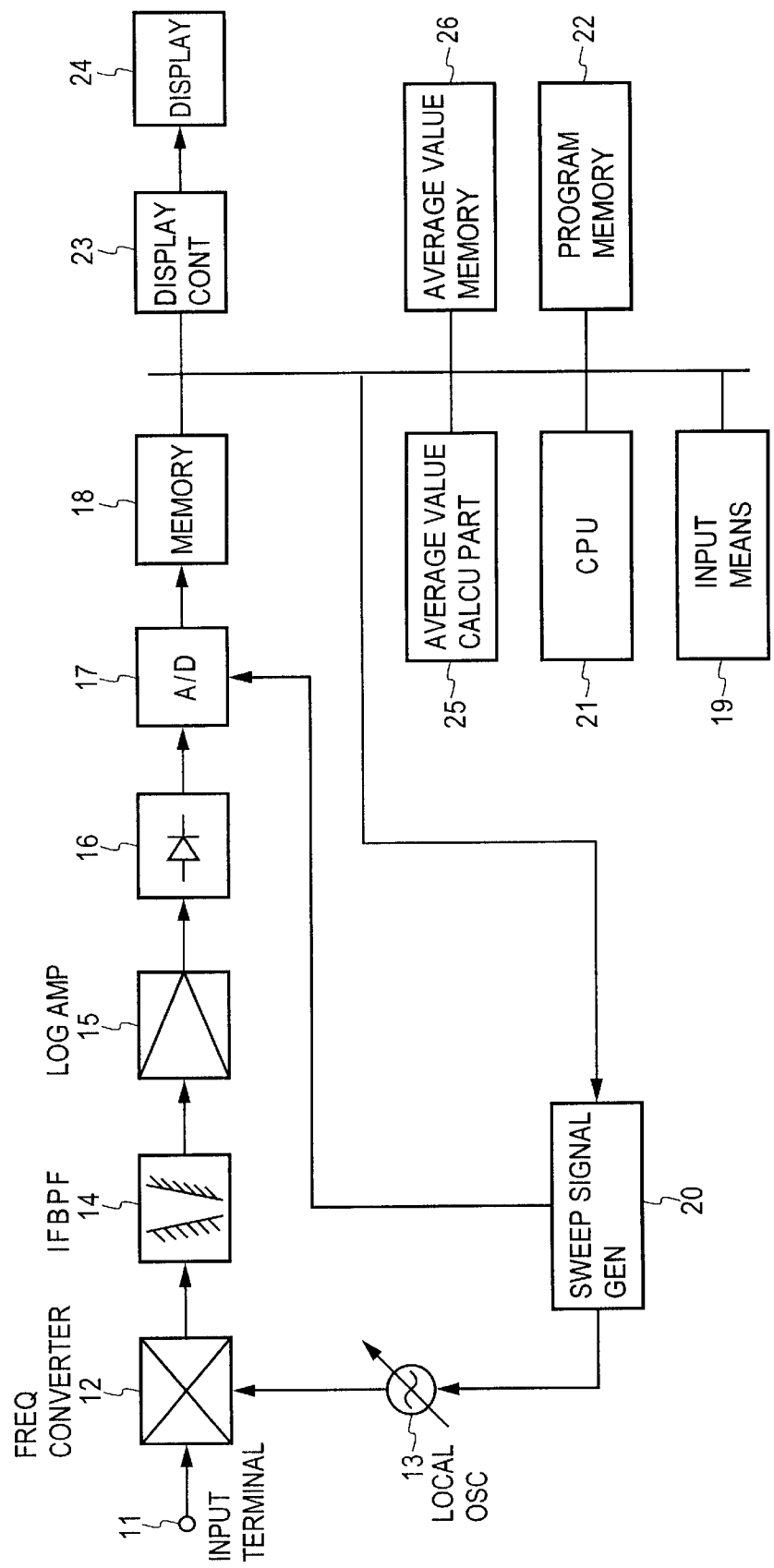
FIG. 1 is a block diagram showing a functional configuration of a conventional spectrum analyzer.
Figure 3:
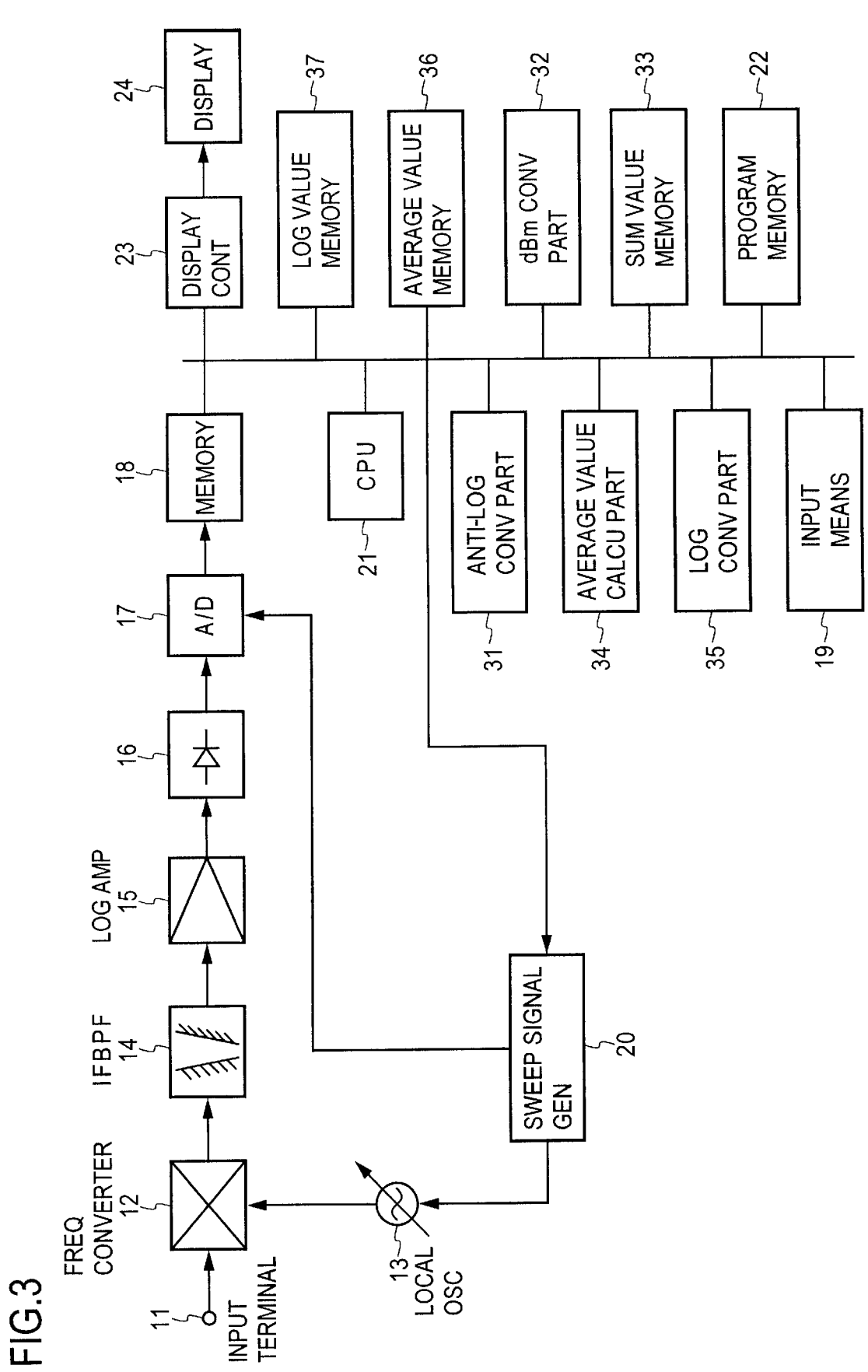
FIG. 3 is a block diagram showing a functional configuration of an embodiment according to the present invention.

FIG. 3 shows an embodiment of the present invention, and portions in FIG. 3 corresponding to those in FIG. 1 have the same reference signs affixed thereto as those in FIG. 1. A anti-logarithm converting part 31 converts, in nth sweep, a measured value $P_{in}$ (dBm) for ith display point into a anti-logarithm $PP_{in}$ in watt (mW) dimension using the following equation.

$$PP_{in} = 10^{\frac{P_{in}}{10}} \text{ (mW)} \qquad (2)$$

Figure 2:
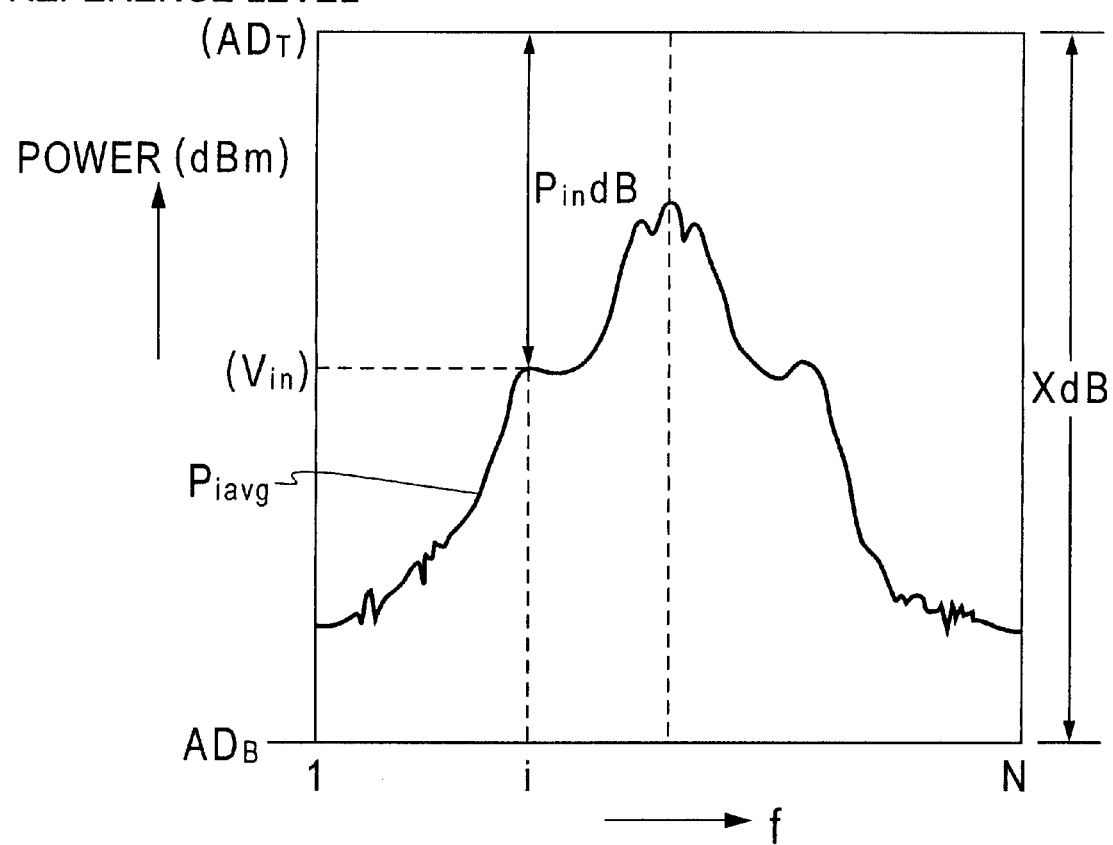
FIG. 2 is a diagram showing an example of a displayed spectrum waveform according to a conventional trace-average displaying method.

Actually, a digital value $V_{in}$ having been converted into the digital value by the AD converter 17 is stored in the memory 18, and this digital value $V_{in}$ is converted into $P_{in}$ having unit of dBm by a dBm converting part 32. This dBm converting part 32 is one that is provided in a usual spectrum analyzer, and performs the following arithmetic operations. When the input signal becomes the maximum, a reference level is set such that the maximum signal level can be displayed at the maximum level position of the display frame on the screen shown in FIG. 2. When a converted digital value outputted from the AD converter 17 for the reference level signal is $A_T$, a converted digital value outputted from the AD converter 17 for the minimum level signal of the display frame is $A_B$, the dB value between the maximum level and the minimum level of the display frame is X, a value in the unit representing 1 mW of the reference level to be 0 dB is Rf dBm, and a digital value for ith display point i in nth sweep is $V_{in}$, $P_{in}$ can be obtained by the following equation.

$$P_{in} = Rf - \frac{(A_T - V_{in})X}{A_T - A_B} \text{ (dBm)} \qquad (3)$$

An average value calculating part 34 sums a anti-logarithm $PP_{in}$ (mW) converted by the anti-logarithm converting part 31 and a summed value $PP_{iA}$ of ith anti-logarithms up to the previous ((n−1)th) sweep stored in a summed value memory 33 to update the summed value $PP_{iA}$ stored in the summed value memory 33. Then the average value calculating part 34 divides a summed value $PP_{iA}$ of ith anti-logarithms up to nth sweep by n to obtain an average value $P_{ia}=PP_{iA}/n$.

A logarithm converting part 35 calculates a logarithm of the average value $P_{ia}$ to obtain a display data $P_i=10\log P_{ia}$ for a display point i, and stores the display data $P_i$ in a logarithmic value memory 37.

Figure 4:
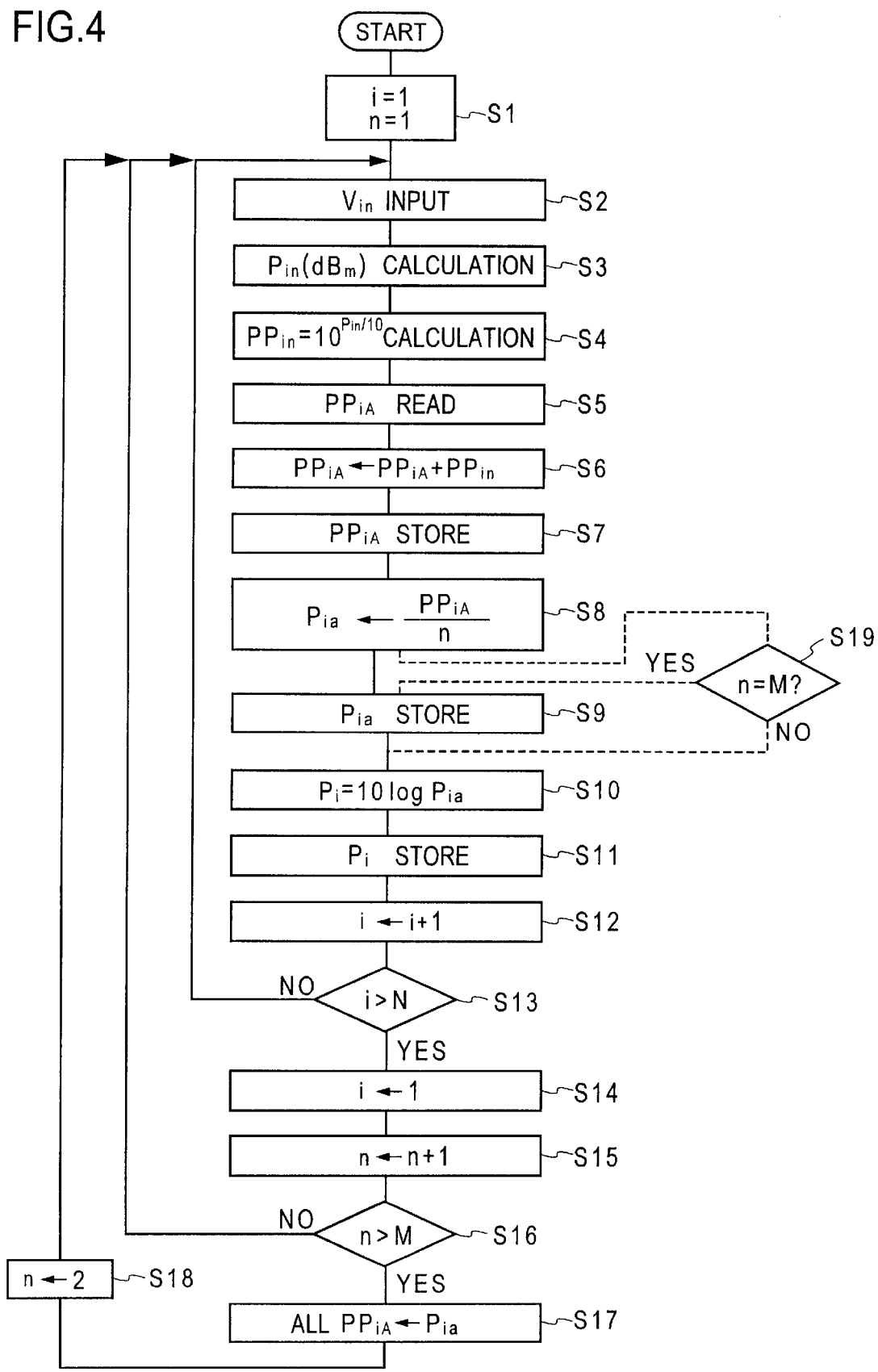
FIG. 4 is a flow-chart showing an example of processing procedure of the spectrum analyzer shown in FIG. 3.

Next, there will be explained with reference to FIG. 4 the procedure that a detected output of an input signal is converted into a digital value by the AD converter 17, the digital value is stored in the memory 18, and the digital values stored in the memory 18 are read out in the sequential order to be processed. First of all, the display point number i is set to 1, and the number of frequency sweeps is set to 1 (S1). A digital value $V_{in}$ is taken out from the memory 18 (S2). A calculation of the equation (3) is performed with respect to the digital value $V_{in}$ by the dBm converting part 32 to obtain a value $P_{in}$ in dBm unit (S3).

A calculation of the equation (2) is performed with respect to this value $P_{in}$ (dBm) by the anti-logarithm converting part 31 to obtain a anti-logarithm $PP_{in}$ in mW unit (S4).

Next, a summed value $PP_{iA}$ of the anti-logarithms for a display point i is taken out from the summed memory 33 (S5). The anti-logarithm $PP_{in}$ and the summed value $PP_{iA}$ are summed (S6) by the average value calculating part 34, and the summed value $PP_{iA}$ in the summed value memory 33 is updated by this summed value (S7). Then the summed result $PP_{iA}$ in the step S6 is divided by the number of sweeps n to obtain an average value $P_{ia}=PP_{iA}/n$ (S8). This average value $P_{ia}$ is stored in an average memory 36 to update the previous average value $P_{ia}$ (S9). In addition, a logarithm of the average value $P_{ia}$ is calculated by the logarithm converting part 35 (S10), and the calculated logarithmic value $P_i=\log 10 P_{ia}$ is stored in the logarithmic value memory 37 (S11).

Then the display point number i is incremented by one (1) (S12), and a check is made to see if i is grater than the maximum display point number N (S13). If i is equal to or less than N, the process returns to the step S2, and a digital value $V_{in}$ is taken out from the memory 18 to perform similar processes. If i is greater than N, the display point number i is set to 1 (S14), and the number of sweeps n is incremented by one (1) (S15). Then a check is made to see if the number of sweeps n is greater than a predetermined value M (S16). If n has not exceeded the predetermined value M, the process returns to the step S2. If n has exceeded the predetermined value M, the summed values $PP_{iA}$–$PP_{NA}$ in the summed value memory 33 are updated by the average values $P_{ia}$–$P_{Na}$ in the average value memory 36, respectively (S17), and the process returns to the step S2 after setting the number of sweeps n to 2 (S18).

Figure 5:
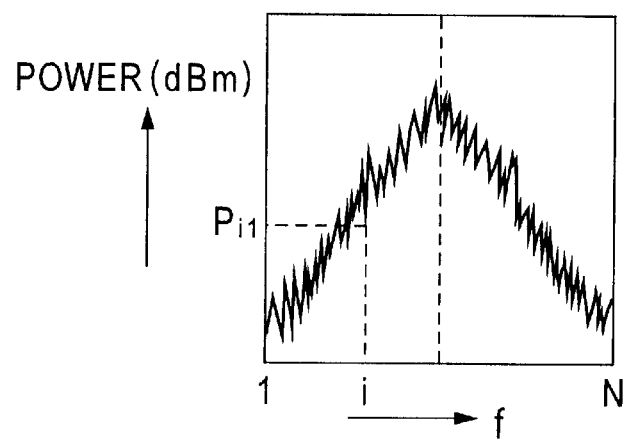
FIG. 5A is a diagram showing an example of power spectrum displayed after first sweep in a method according to the present invention.
FIG. 5B is a diagram showing an example of power spectrum displayed after second sweep in a method according to the present invention.
FIG. 5C is a diagram showing an example of power spectrum displayed after nth (n>3) sweep in a method according to the present invention.
Figure 5:
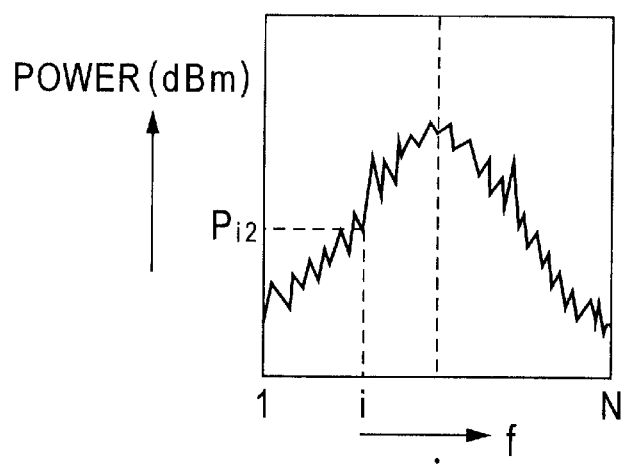
Figure 5:
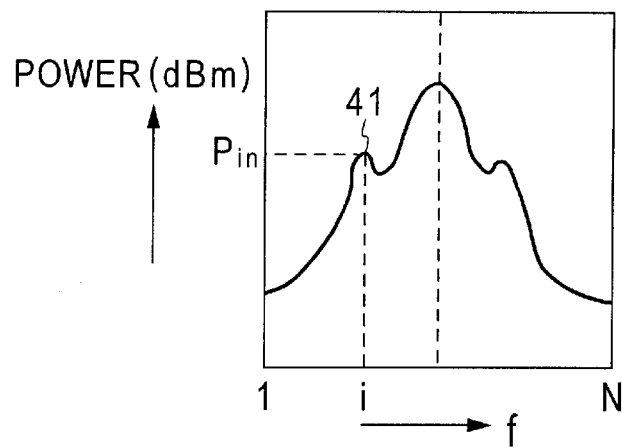

The display control part 23 displays the logarithmic values $P_i$ in the logarithmic value memory 37 for respective display points i on the display device 24. Therefore, in the first frequency-sweep time, when the display data for respective display points i, namely the logarithmic values $P_i$ are obtained, those logarithmic values are displayed in the sequential order. In the second frequency-sweep time, an average value of the anti-logarithm obtained this time and the anti-logarithm for the corresponding display point obtained in the previous frequency-sweep time is obtained for each display point. When a logarithmic value of each average value is obtained for each display point, the logarithmic value is displayed in the sequential order. After this, similarly to the above operations, in each frequency-sweep time, a anti-logarithm for each display point and the summed value of the anti-logarithms up to previous sweep time for the same display point are summed to obtain their average value. Then a logarithmic value of the average value is obtained to be displayed. Therefore, immediately after the frequency-sweep is started, the display operation is performed. As the number of sweeps is increased, the number of samples to be averaged is increased. Hence the stability of the display is increased and the accuracy is also increased. For example, in the first frequency-sweep, a power spectrum shown in FIG. 5A is displayed. As illustrated, the power spectrum is terribly fluctuated. In the second frequency-sweep, a power spectrum shown in FIG. 5B is displayed. The fluctuation of this power spectrum is decreased. Furthermore, in the nth frequency-sweep, as shown in FIG. 5C, the terrible fluctuation has disappeared and a stable display is obtained. At the same time, since the averaging process is performed with respect to anti-logarithms converted from dBm values, correct values are displayed. Regarding a signal like a CDMA signal having similarities to a noise, an average of each power spectrum can be obtained, and hence the process of the present invention is very convenient.

If the number of sweeps n is a large number, the summed value $PP_{iA}$ of the anti-logarithms $PP_{in}$ becomes a large number, and hence the summed value $PP_{iA}$ cannot be stored in the summed value memory 33. Therefore, as explained in the step S17 in FIG. 4, when n becomes a predetermined value M, for example 100, each summed value $PP_{iA}$ is updated by an average value $P_{ia}$ up to then. Since this update is performed when n has exceeded M, the average value $P_{ia}$ obtained in the step S8 may be stored in the average value memory 36 only when n is n=M. That is, after a check is made, as shown by dashed lines after the step S8 in FIG. 4, to see if n is equal to M (S19), the process may move to the step S10 if n is not equal to M, or the process may move, only when n is equal to M, to the step S9 to store the average value $P_{ia}$ in the average value memory 36 and to execute thereafter the step S10.

Further, as shown in FIG. 5C, when a marker 41 is moved to an arbitrary position on the displayed waveform and the position is clicked, it is performed by a function provided in a usual spectrum analyzer that a logarithmic average value Pi for that display point i is read out from the logarithmic value memory 37 and is displayed as a numeric value on a part of the display device 24.

Figure 6:
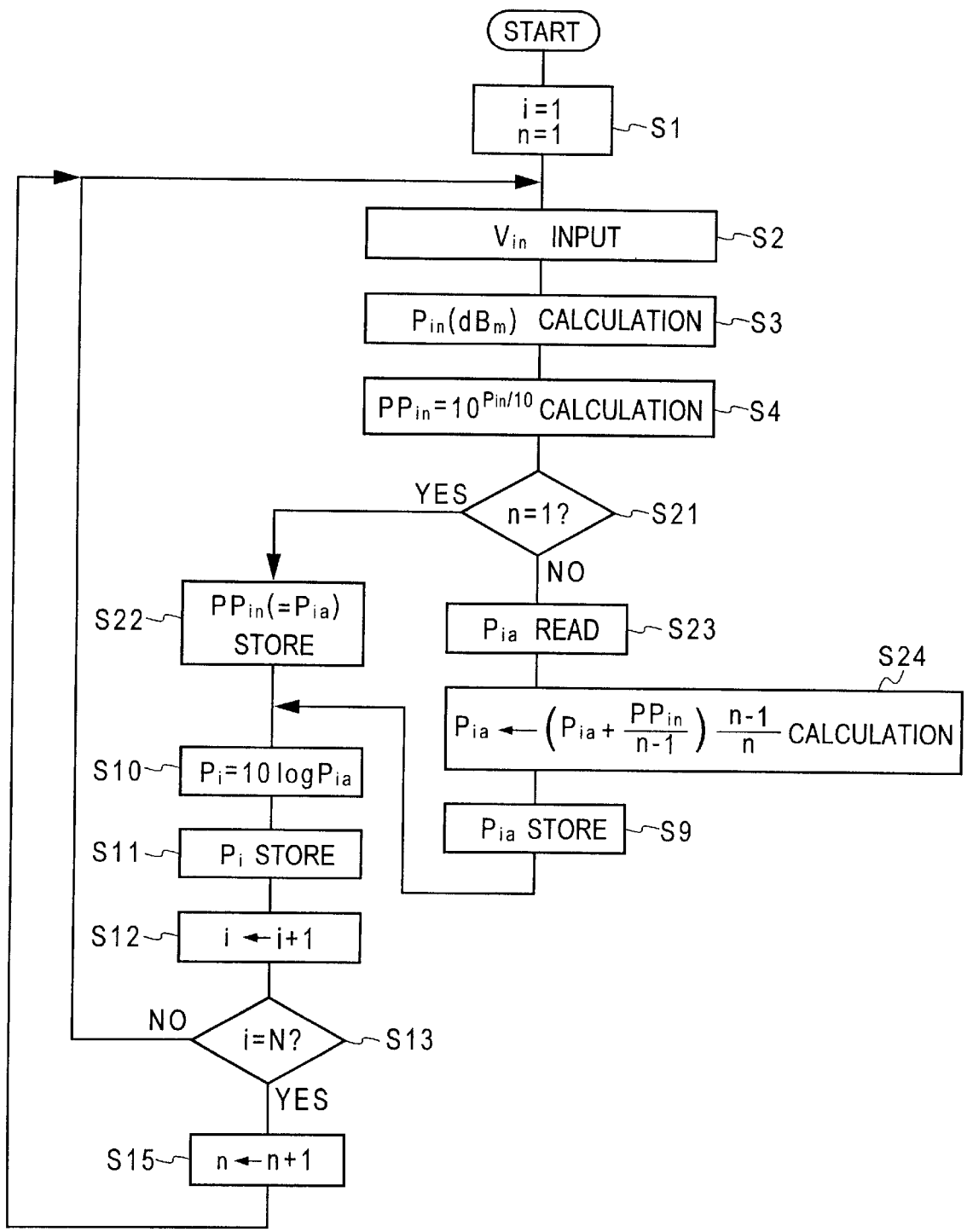
FIG. 6 is a flow-chart showing an example where a part of the method according to the present invention is changed.

The process for obtaining an average of anti-logarithms $PP_{in}$ may be performed as shown in FIG. 6. Processing steps in FIG. 6 that are same as those in FIG. 4 have the same step signs affixed thereto as those in FIG. 4. In this case, after a anti-logarithm $PP_{in}$ is calculated in step S4, a check is made to see if the sweep is the first sweep (S21). When the sweep is the first sweep (n=1), the anti-logarithm $PP_{in}$ is stored in the average value memory 36 as an average value $P_{ia}$ (S22), and at the same time $P_i$ is obtained by calculating a logarithm of the average value $P_{ia}$ (S10). Thereafter, the steps S11,S12,S13 and S15 are performed. If the number of sweeps is not one (n≠1) in the step S21, an average value $P_{ia}$ up to the previous sweep is read out from the average value memory 36 (S23), and an average $P_{ia}$ is calculated by the average value calculating part 34 using the following equation based on this $P_{ia}$ and the $PP_{in}$ obtained in the step S4 (S24).

$$P_{ia} \leftarrow \left(P_{ia} + \frac{PP_{in}}{n-1}\right)\frac{n-1}{n}$$

This average value $P_{ia}$ is stored in the average value memory 36 (S9), and at the same time a logarithm of the $P_{ia}$ is calculated to obtain $P_i$, namely the process moves to the step S10 and following steps.

As mentioned above, according to the present invention, anti-logarithm power values in watt dimension are averaged for each display point, and a logarithm of this average value is displayed as a spectrum. Therefore, a true envelope waveform of power average of a digital-modulated wave, a noise signal or the like can be displayed.

Moreover, since the logarithmic amplifier 15 is used to compress the signal level, even if cheap equipments each having a relatively small dynamic range are used as an envelope detector 16 and an AD converter 17, power of an input signal having a large dynamic range can be measured. Consequently, the spectrum analyzer can be cheaply constructed as a whole.

In addition, according to the present invention, the averaging process is performed for each sweep, and hence the power spectrum is displayed in short time for each sweep. Therefore, the general trend of the power spectrum can be known quickly. Moreover, an average (integral) for each of all the display points is not obtained during one sweep time. It is sufficient that sampling operations are performed N (N is the number of display points) times per one sweep by the AD converter 17. That is, a high speed AD converter is not required as the AD converter 17, and hence the spectrum analyzer can also be constructed cheaply from this point.

One of, a plurality of, or all of the anti-logarithm converting part 31, the dBm converting part 32, the average value calculating part 34 and the logarithm converting part 35 can also be functioned by a software by decoding and executing programs by the CPU 21.

What is claimed is:

1. A spectrum measuring method using a spectrum analyzer comprising the steps of:

repeating a frequency-sweep of frequencies of a received signal;

logarithmically amplifying the received signal;

detecting an amplified output;

converting a detected output into a digital signal value;

converting the digital signal value into a decibel value representing 1mW to be 0 dBm;

calculating $10^{P_{in}/10}$ to obtain a anti-logarithm power value $PP_{in}$ in watt (mW) dimension for each of display points i within a width of the frequency-sweep;

averaging for the same display point the power values converted into anti-logarithms that are obtained by repeating the frequency-sweep;

converting an average power value for each display point into a logarithmic value; and displaying the logarithmic average power value for each display point as a spectrum.

2. The measuring method according to claim 1 wherein said step of averaging is characterized in that:

a power value $PP_{in}$ for each display point i obtained in each sweep and a summed value $PP_{iA}$ of the power values obtained up to the previous sweep are summed to update the summed value $PP_{iA}$, and the updated summed value $PP_{iA}$ is divided by the number of sweeps n up to then to obtain an average power $P_{ia}$ for each display point i.

3. The measuring method according to claim 2 wherein:

the summed value $PP_{iA}$ of the power values for each display point i is stored in a summed value memory;

whenever a power value $PP_{in}$ is obtained, a corresponding summed value $PP_{iA}$ is read out from said summed value memory to sum the $PP_{iA}$ and the $PP_{in}$, and this summed value is stored in said summed value memory as the $PP_{iA}$ to update the summed value $PP_{iA}$; and when the number of sweeps n becomes a predetermined value, summed values $PP_{iA}$–$PP_{NA}$ in said summed memory are updated by respective average power values $P_{ia}$ –$P_{Na}$ for respective display points, and then the number of sweep n is updated to 2.

4. The measuring method according to claim 1 wherein:

in first sweep (n=1), a anti-logarithm power value $PP_{i1}$ for each display point is stored in an average value memory as an average value $P_{ia}$; and in nth sweep (n≧2), after obtaining a anti-logarithm power value $PP_{in}$, a previous average power value $P_{ia}$ is taken out from said average value memory to obtain the average power value by a calculation of $$P_{ia} \leftarrow \left(P_{ia} + \frac{PP_{in}}{n-1}\right)\frac{n-1}{n},$$

and then the average power value $P_{ia}$ in said average value memory is updated.

5. A spectrum analyzer comprising:

means for repeating a frequency-sweep of frequencies of a received signal;

an amplifier for logarithmically amplifying the received signal;

a detector for detecting a logarithmically amplified output;

an AD converter for converting a detected output into a digital signal value;

anti-logarithm converting means for converting the digital signal value into a decibel value $P_{in}$ (dBm) representing 1 mW to be 0 dBm, and for inputting therein the decibel value $P_{in}$, and for calculating $10^{P_{in}/10}$ to obtain a anti-logarithmic power value $PP_{in}$ in watt (mW) dimension for each of display points i (i=1,2, . . . , N) within a width of the frequency-sweep;

average value calculating means for calculating, for the same display point, an average of the power values converted into anti-logarithms that are obtained by repeating the frequency-sweep;

logarithm converting means for logarithmically converting the average power value for each display point to output a logarithmic average power value;

a logarithmic value memory for storing therein the logarithmic average power value for each display point, and for updating therein the logarithmic average power value by an output of said logarithm converting means; and a display device for displaying, when the logarithmic average power value for each display point is read out from said logarithmic value memory, the logarithmic average power value at each display point as a spectrum.

6. The spectrum analyzer according to claim 5 wherein said average value calculating means comprises:

summing means for summing a power value $PP_{in}$ for a display point i from said anti-logarithm converting means and a summed power value $PP_{iA}$ for the display point i taken out from a summed value memory;

said summed value memory for storing therein a summed power value $PP_{iA}$ for each display point i and for updating therein the summed power value $PP_{iA}$ of the corresponding display point by a summed result of said summing means; and dividing means for dividing the summed result $PP_{iA}$ of said summing means by the number of sweep repetitions n to output the average power value for the display point i.

7. The spectrum analyzer according to claim 6 further comprising:

an average value memory for storing therein, for each display point i, an average power value $P_{ia}$ outputted from said average value calculating means;

means for updating, when it is detected that the number of sweep repetitions n has exceeded a predetermined number M, the summed value $PP_{iA}$ of the power values for each display point i stored in said summed value memory by the average power value $P_{ia}$ for each display point i stored in said average value memory for the number of sweep repetitions n; and means for changing the number of sweep repetitions n to 2.

8. The spectrum analyzer according to claim 5 wherein said average value calculating means comprises:

arithmetic operation means to which an average power value $P_{ia}$ for a display point i taken out from an average value memory, a power value $PP_{in}$ for a display point i from said anti-logarithm converting means and the number of sweeps n are inputted, for calculating $$P_{ia} \leftarrow \left(P_{ia} + \frac{PP_{in}}{n-1}\right)\frac{n-1}{n}, \text{ and}$$

said average value memory for storing therein an average power value $P_{ia}$ for each display point i and for updating therein the average power value $P_{ia}$ of a display point corresponding to the arithmetic operation result $P_{ia}$ of said arithmetic operation means.

* * * * *